US012581920B2

(12) United States Patent
Nagai et al.

(10) Patent No.: US 12,581,920 B2
(45) Date of Patent: Mar. 17, 2026

(54) SEMICONDUCTOR MANUFACTURING DEVICE AND METHOD OF MANUFACTURING SEMICONDUCTOR DEVICE

(71) Applicant: KIOXIA CORPORATION, Tokyo (JP)

(72) Inventors: Satoshi Nagai, Yokkaichi Mie (JP); Hirofumi Sato, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 659 days.

(21) Appl. No.: 17/891,601

(22) Filed: Aug. 19, 2022

(65) Prior Publication Data

US 2023/0326753 A1 Oct. 12, 2023

(30) Foreign Application Priority Data

Mar. 22, 2022 (JP) ................................. 2022-046058

(51) Int. Cl.
*H01L 21/308* (2006.01)
*H01L 21/027* (2006.01)
(Continued)

(52) U.S. Cl.
CPC ...... *H01L 21/0271* (2013.01); *H01L 21/3086* (2013.01); *H01L 21/31144* (2013.01);
(Continued)

(58) Field of Classification Search
CPC ............. H01L 21/0271; H01L 21/3086; H01L 21/31144
See application file for complete search history.

(56) References Cited

U.S. PATENT DOCUMENTS 6,143,478 A 11/2000 Toshima et al.
7,959,983 B1 * 6/2011 Farrar ................... B05B 7/1606
427/244

(Continued)

FOREIGN PATENT DOCUMENTS

JP H03-245875 A 11/1991
JP 2007-105617 A 4/2007
(Continued)

OTHER PUBLICATIONS

Fukumi, K., "How to read the phase equilibrium diagram," New Glass, 29(113):34-48 (2014); URL: https://www.newglass.jp/mag/TITL/maghtml/113.html.

*Primary Examiner* — Dale E Page
*Assistant Examiner* — Wilner Jean Baptiste
(74) *Attorney, Agent, or Firm* — Foley & Lardner LLP

(57) ABSTRACT

According to one embodiment, a semiconductor manufacturing device includes a processing chamber that accommodates a substrate, a support that supports the substrate, a nozzle that supplies a resist material onto the substrate, a first temperature regulator, and a second temperature regulator. The first temperature regulator is attached to the support and the second temperature regulator is attached to the processing chamber, At least one of the first temperature regulator or the second temperature regulator forms a resist film from the resist material by regulating a temperature of the resist material.

10 Claims, 6 Drawing Sheets

(51) Int. Cl.
    *H01L 21/311*          (2006.01)
    *H01L 21/3213*         (2006.01)
    *H01L 21/67*           (2006.01)
(52) U.S. Cl.
    CPC .... *H01L 21/32139* (2013.01); *H01L 21/6715* (2013.01); *H01L 21/67248* (2013.01)

(56)                    References Cited

U.S. PATENT DOCUMENTS

| | | | |
|---|---|---|---|
| 8,911,193 B2* | 12/2014 | Rice | H01L 21/67742 |
| | | | 414/935 |
| 2007/0084825 A1 | 4/2007 | Yashima | |
| 2011/0261123 A1* | 10/2011 | Mehta | B41J 2/1628 |
| | | | 347/93 |
| 2016/0218012 A1 | 7/2016 | Shimamoto et al. | |
| 2020/0035920 A1* | 1/2020 | Han | C23C 14/243 |
| 2020/0146111 A1 | 5/2020 | Sekimoto | |
| 2021/0208504 A1 | 7/2021 | Yamauchi et al. | |

FOREIGN PATENT DOCUMENTS

| | | |
|---|---|---|
| JP | 2010-040921 A | 2/2010 |
| JP | 2011-035186 A | 2/2011 |
| JP | 2012-119536 A | 6/2012 |
| TW | 201517123 A | 5/2015 |
| TW | 202014044 A | 4/2020 |
| TW | 202141570 A | 11/2021 |
| WO | WO-2019/230462 A1 | 12/2019 |

* cited by examiner

T>T$_1$

T≤T$_2$

T=T$_3$

T<T$_4$

SEMICONDUCTOR MANUFACTURING DEVICE AND METHOD OF MANUFACTURING SEMICONDUCTOR DEVICE

CROSS-REFERENCE TO RELATED APPLICATION

This application is based upon and claims the benefit of priority from Japanese Patent Application No. 2022-046058, filed Mar. 22, 2022, the entire contents of which are incorporated herein by reference.

FIELD

Embodiments described herein relate generally to a semiconductor manufacturing device and a method of manufacturing a semiconductor device.

BACKGROUND

When a resist film is formed on an uneven film, planarity of a surface of the resist film may worsen.

DETAILED DESCRIPTION

Embodiments provide a semiconductor manufacturing device and a method of manufacturing a semiconductor device capable of improving planarity of a surface of a resist film.

In general, according to one embodiment, a semiconductor manufacturing device includes: an accommodation section that accommodates a substrate; a support section or a support that supports the substrate in the accommodation section; and a resist material supply section that supplies a resist material onto the substrate. The semiconductor manufacturing device further includes a resist film forming section that includes a first temperature regulation section (or a first temperature regulator) attached to the support section and a second temperature regulation section (or a second temperature regulator) attached to the accommodation section, and that forms a resist film from the resist material by allowing the first and second temperature regulation sections to regulate a temperature of the resist material.

Embodiments of the disclosure will be described hereinafter with reference to the drawings. In FIGS. 1A to 7D, the same configurations are denoted by the same reference signs and are not repeatedly described.

First Embodiment

Figure 1A:
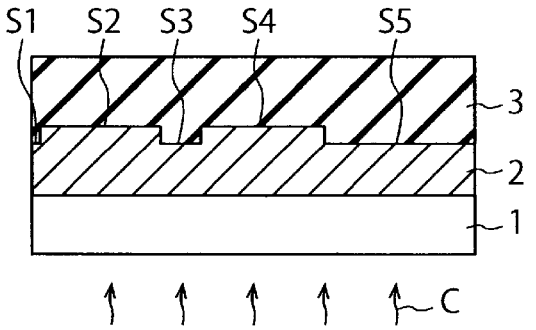
FIGS. 1A to 1C are cross-sectional views illustrating a method of manufacturing a semiconductor device according to a first embodiment.
Figure 1B:
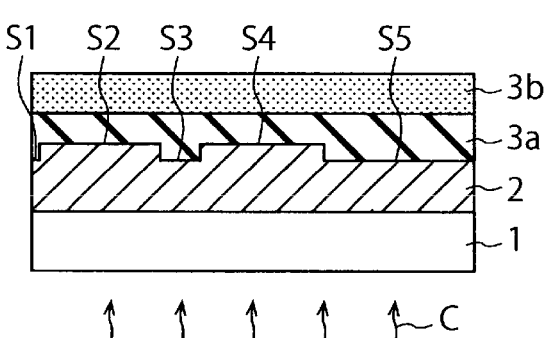
Figure 1B:
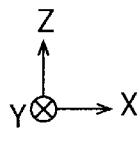
Figure 1C:
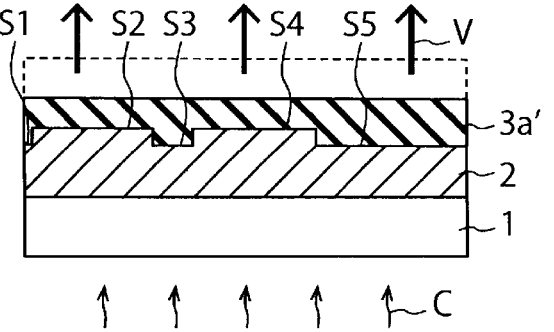
Figure 1C:
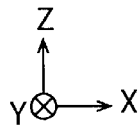

FIGS. 1A to 1C are cross-sectional views illustrating a method of manufacturing a semiconductor device according to a first embodiment.

First, a film 2 is formed on a substrate 1, a resist material 3 is formed on the film 2, and the substrate 1 is cooled as schematically indicated by arrows C (FIG. 1A). The substrate 1 itself as well as the film 2 and the resist material 3 on the substrate 1 is thereby cooled. The film 2 is an example of a first film.

The substrate 1 is, for example, a semiconductor substrate such as a silicon (Si) substrate. FIG. 1A illustrates an X direction and a Y direction parallel to a surface of the substrate 1 and perpendicular to each other, and a Z direction perpendicular to the surface of the substrate 1. In the present embodiment, a +Z direction is treated as an upward direction, and a −Z direction is treated as a downward direction. The −Z direction may or may not coincide with a gravitational direction.

The film 2 is a to-be-processed film to be processed by lithography and etching using the resist material 3. The film 2 is, for example, a conductor film, a semiconductor film, or an insulating film. The film 2 in the present embodiment has an uneven surface. FIG. 1A illustrates an example of upper surfaces S1, S2, S3, S4, and S5 of the film 2. The film 2 illustrated in FIG. 1A has uneven portions between the upper surfaces S1 and S2, between the upper surfaces S2 and S3, between the upper surfaces S3 and S4, and between the upper surfaces S4 and S5. These uneven portions may be formed on the film 2 by whatever cause.

The resist material 3 is a material for forming a resist film. For example, the resist material 3 is a liquid and a resist film is a solid. In FIG. 1A, the resist material 3 is the liquid, so that a surface of the resist material 3 is planar despite the uneven portions on the surface of the film 2. The resist material 3 is formed on the film 2 by, for example, spin coating. The resist material 3 contains, for example, a resist polymer as a solute and contains a solvent as a solvent. In the present embodiment, the resist polymer has a large molecular weight and the solvent has a small molecular weight. The resist material 3 may also contain other solutes and solvents.

While the resist material 3 is formed on the substrate 1 via the film 2 in the present embodiment, the resist material 3 may be directly formed on the substrate 1. For example, when the substrate 1 is a to-be-processed object, the resist material 3 may be directly formed on the substrate 1. In this case, the substrate 1 may have uneven portions on a surface similarly to the film 2 illustrated in FIG. 1A.

In the present embodiment, the substrate 1 is cooled as illustrated in FIG. 1A. Cooling of the substrate 1 starts after formation of the resist material 3 in the present embodiment. However, the cooling of the substrate 1 may start during formation of the resist material 3 or before formation of the resist material 3. In the present embodiment, the substrate 1 is cooled for cooling the resist material 3. The resist material 3 may be cooled either via or without via the substrate 1.

Next, the resist material 3 is separated into a gel layer 3a and a liquid layer 3b on the film 2 (FIG. 1B). The resist material 3 is, for example, a material that goes through phase separation in response to a temperature change and specifically a material that goes through phase separation at a lower temperature than an ordinary temperature. Owing to this, when the resist material 3 is cooled, then the phase separation occurs in the resist material 3 and the resist material 3 is separated into the gel layer 3*a* and the liquid layer 3*b*. In the present embodiment, the gel layer 3*a* mainly contains the resist polymer and the liquid layer 3*b* mainly contains the solvent. The gel layer 3*a* is a gel-like layer and sinks below the liquid layer 3*b*. The liquid layer 3*b* is a liquid-like layer and floats above the gel layer 3*a*. Owing to this, a two-layer structure of the gel layer 3*a* and the liquid layer 3*b* is formed on the film 2 and an interface is formed between the gel layer 3*a* and the liquid layer 3*b*. In general, the smaller interface is more stable energetically, so that this interface is a planar surface.

A temperature at which the phase separation occurs in the resist material 3 is referred herein to as "phase separation temperature." In the present embodiment, the resist material 3 is formed at a higher temperature, e.g., the ordinary temperature, than the phase separation temperature, and the temperature of the resist material 3 is then reduced from the higher temperature than the phase separation temperature to a lower temperature than the phase separation temperature. The phase separation thereby occurs in the resist material 3 and the resist material 3 is separated into the gel layer 3*a* and the liquid layer 3*b*. The higher temperature than the phase separation temperature is an example of a first temperature and the lower temperature than the phase separation temperature is an example of a second temperature.

This "lower temperature than the phase separation temperature" is preferably equal to or higher than 0° C. and more preferably equal to or higher than 10° C. Setting this temperature equal to or higher than 0° C. enables prevention of, for example, transformation of water into ice in or out of the resist material 3. Furthermore, setting this temperature equal to or higher than 10° C. enables prevention of, for example, generation of dew condensation near the resist material 3 or the like. Meanwhile, when the semiconductor device according to the present embodiment is manufactured in a clean room, the "higher temperature than the phase separation temperature" is, for example, a temperature of the clean room.

The phase separation of the resist material 3 can be made to occur more frequently by, for example, setting greater a difference between the molecular weight of the resist polymer and the molecular weight of the solvent. This enables the phase separation temperature of the resist material 3 to be regulated to a desired temperature. The phase separation of the resist material 3 may tend to occur by setting greater a difference between polarity of the resist polymer and polarity of the solvent or greater a difference between a shape of the resist polymer and a shape of the solvent.

Next, the liquid layer 3*b* is volatilized as schematically indicated by reference signs V to remove the liquid layer 3*b* on the substrate 1 (FIG. 1C). The liquid layer 3*b* can be volatilized by, for example, reducing an internal pressure of a processing chamber accommodating the substrate 1. At this time, at least part of a liquid component, e.g., the solvent, remaining in the gel layer 3*a* can be also volatilized. In this way, a resist film 3*a'* is formed from the gel layer 3*a*. The resist film 3*a'* is a solid that contains, for example, the resist polymer. In the present embodiment, this resist polymer gives etching resistance to the resist film 3*a'*. Solidification of the gel layer 3*a* to the resist film 3*a'* can be realized by, for example, further reducing the temperature of the gel layer 3*a*.

According to the present embodiment, by planarizing a surface of the gel layer 3*a*, a surface of the resist film 3*a'* can be planarized. When an amount of the liquid component volatilized from the gel layer 3*a* is large during transformation of the gel layer 3*a* to the resist film 3*a'*, a volume of the resist film 3*a'* may be smaller than a volume of the gel layer 3*a*. As a result, planarity of the surface of the resist film 3*a'* may worsen. However, the gel layer 3*a* in the present embodiment is formed by separating the liquid layer 3*b* from the resist material 3; therefore, a content of the liquid component is low in the gel layer 3*a*. Thus, according to the present embodiment, by separating the resist material 3 into the gel layer 3*a* and the liquid layer 3*b* and then volatilizing the liquid, it is possible to reduce a reduction in volume when the resist film 3*a'* is formed. It is thereby possible to reduce degradation of the planarity of the surface of the resist film 3*a'* in response to the volume reduction.

The liquid layer 3*b* on the substrate 1 may be removed by rotating the substrate 1 instead of volatilizing the liquid layer 3*b*. When the substrate 1 is rotated, a centrifugal force acts on the liquid layer 3*b* and the liquid in the liquid layer 3*b* is shaken down from the substrate 1. At this time, at least part of the liquid component remaining in the gel layer 3*a* is also shaken down from the substrate 1 by the centrifugal force. In this way, a resist film 3*a'* is formed from the gel layer 3*a*. When the liquid layer 3*b* is removed by rotating the substrate 1, the temperature of the gel layer 3*a* may be further reduced to solidify the gel layer 3*a* before removal. This can prevent distortion of a shape of the gel layer 3*a* on the substrate 1 and shaking down of the resist polymer in the gel layer 3*a* from the substrate 1. When the gel layer 3*a* has high viscosity, the liquid layer 3*b* can be sufficiently removed by rotating the substrate 1 at a lower revolving speed.

In this way, the liquid layer 3*b* may be removed either by volatilization or by rotation. The removal of the liquid layer 3*b* by volatilization has an advantage, for example, that the degradation of the planarity of the surface of the resist film 3*a'* is easy to reduce. Meanwhile, the removal of the liquid layer 3*b* by rotation has an advantage, for example, that the liquid layer 3*b* can be removed in a short time.

In the present embodiment, the resist film 3*a'* is then patterned to process the resist film 3*a'* into a resist mask, and the film 2 is processed by etching using the resist mask. Furthermore, various devices, interconnections, plugs, insulating films, and the like are formed on the substrate 1. In this way, the semiconductor device according to the present embodiment is manufactured.

Figure 2A:
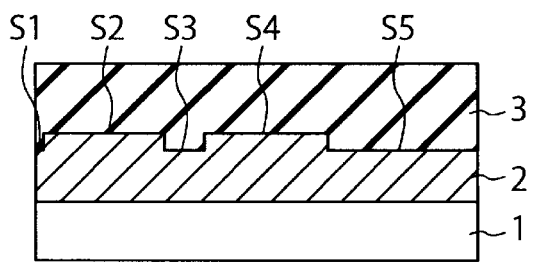
FIGS. 2A and 2B are cross-sectional views illustrating a method of manufacturing a semiconductor device according to a comparison of the first embodiment.
Figure 2B:
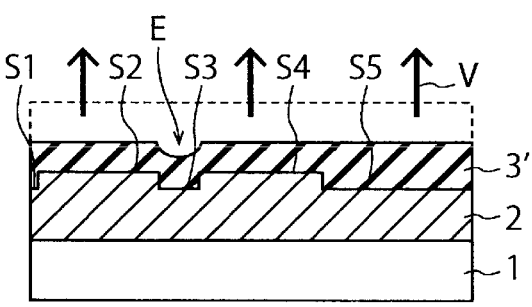
Figure 2B:
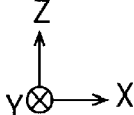

FIGS. 2A and 2B are cross-sectional views illustrating a method of manufacturing a semiconductor device according to a comparison of the first embodiment.

First, the film 2 is formed on the substrate 1 and the resist material 3 is formed on the film 2 (FIG. 2A). In the present comparison, the substrate 1 is not cooled. Therefore, the resist material 3 in the present comparison is not separated into the gel layer 3*a* and the liquid layer 3*b*.

Next, as schematically indicated by reference signs V, the liquid component in the resist material 3 is volatilized to remove at least part of the liquid component from the resist material 3 on the substrate 1 (FIG. 2B). The liquid component can be volatilized by, for example, heating the resist material 3 to dry the resist material 3. In this way, a resist film 3' is formed from the resist material 3. The resist film 3' is a solid that contains, for example, a resist polymer. Solidification of the resist material 3 to the resist film 3' can be realized by, for example, further increasing the temperature of the resist material 3.

In the present comparison, the amount of the liquid component volatilized from the resist material 3 is large during transformation of the resist material 3 to the resist film 3', so that a volume of the resist film 3' is smaller than a volume of the resist material 3. As a result, the planarity of a surface of the resist film 3' worsens. In FIG. 2B, a recessed portion E is generated in a surface of the resist film 3', which aggravates the planarity. The recessed portion E in the present comparison is generated above the upper surface S3 since the upper surface S3 is lower than the upper surfaces S2 and S4.

On the other hand, according to the present embodiment, by separating the resist material 3 into the gel layer 3a and the liquid layer 3b and then volatilizing the liquid, it is possible to improve the planarity of the surface of the resist film 3a'.

Figure 3A:
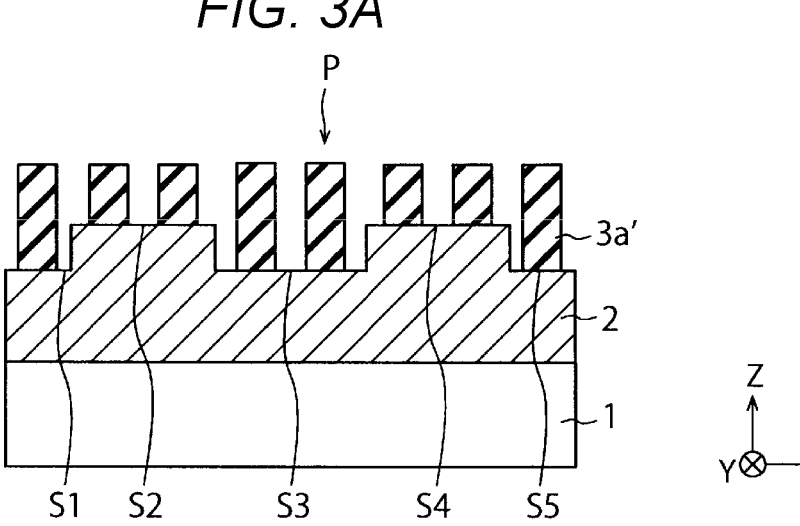
FIGS. 3A and 3B are cross-sectional views illustrating comparison of the first embodiment with the comparison.
Figure 3B:
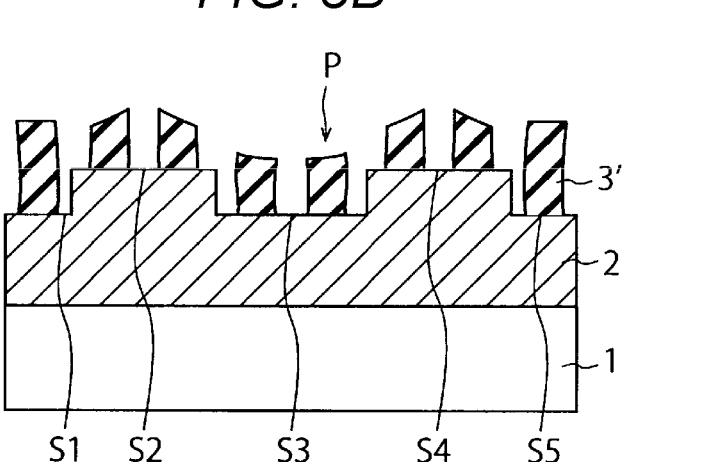
Figure 3B:
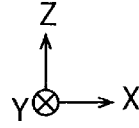

FIGS. 3A and 3B are cross-sectional views illustrating comparison of the first embodiment with the comparison.

FIG. 3A illustrates the method of manufacturing the semiconductor device according to the present embodiment and specifically illustrates a process subsequent to a process illustrated in FIG. 1C. In the present embodiment, the resist film 3a' is patterned after formation of the resist film 3a' to process the resist film 3a' into the resist mask (FIG. 3A). FIG. 3A illustrates a plurality of resist patterns P provided in the resist film 3a' (resist mask). Subsequently, etching is performed using these resist patterns P as a mask to process the film 2.

FIG. 3B illustrates the method of manufacturing the semiconductor device according to the comparison and specifically illustrates a process subsequent to a process illustrated in FIG. 2B. In the present comparison, the resist film 3' is patterned after formation of the resist film 3' to process the resist film 3' into the resist mask (FIG. 3B). FIG. 3B illustrates a plurality of resist patterns P provided in the resist film 3' (resist mask). Subsequently, etching is performed using these resist patterns P as a mask to process the film 2.

As described above, according to the present comparison, the planarity of the surface of the resist film 3' worsens. The poor planarity of the surface of the resist film 3' adversely influences exposure light for exposing the resist film 3' on the surface of the resist film 3'. For example, the exposure light is refracted in an unintended direction on the surface of the resist film 3'. As a result, as illustrated in FIG. 3B, the resist patterns P in the present comparison may be patterned into a distorted shape.

According to the present embodiment, by contrast, the planarity of the surface of the resist film 3a' can be improved. This can reduce occurrence of the adverse influence described above. According to the present embodiment, therefore, it is possible to prevent the resist patterns P from being patterned into the distorted shape (FIG. 3A).

As described so far, the resist film 3a' in the present embodiment is formed from the gel layer 3a after the resist material 3 is separated into the gel layer 3a and the liquid layer 3b. According to the present embodiment, therefore, the planarity of the surface of the resist film 3a' can be improved.

Second Embodiment

Figures 4, 5:
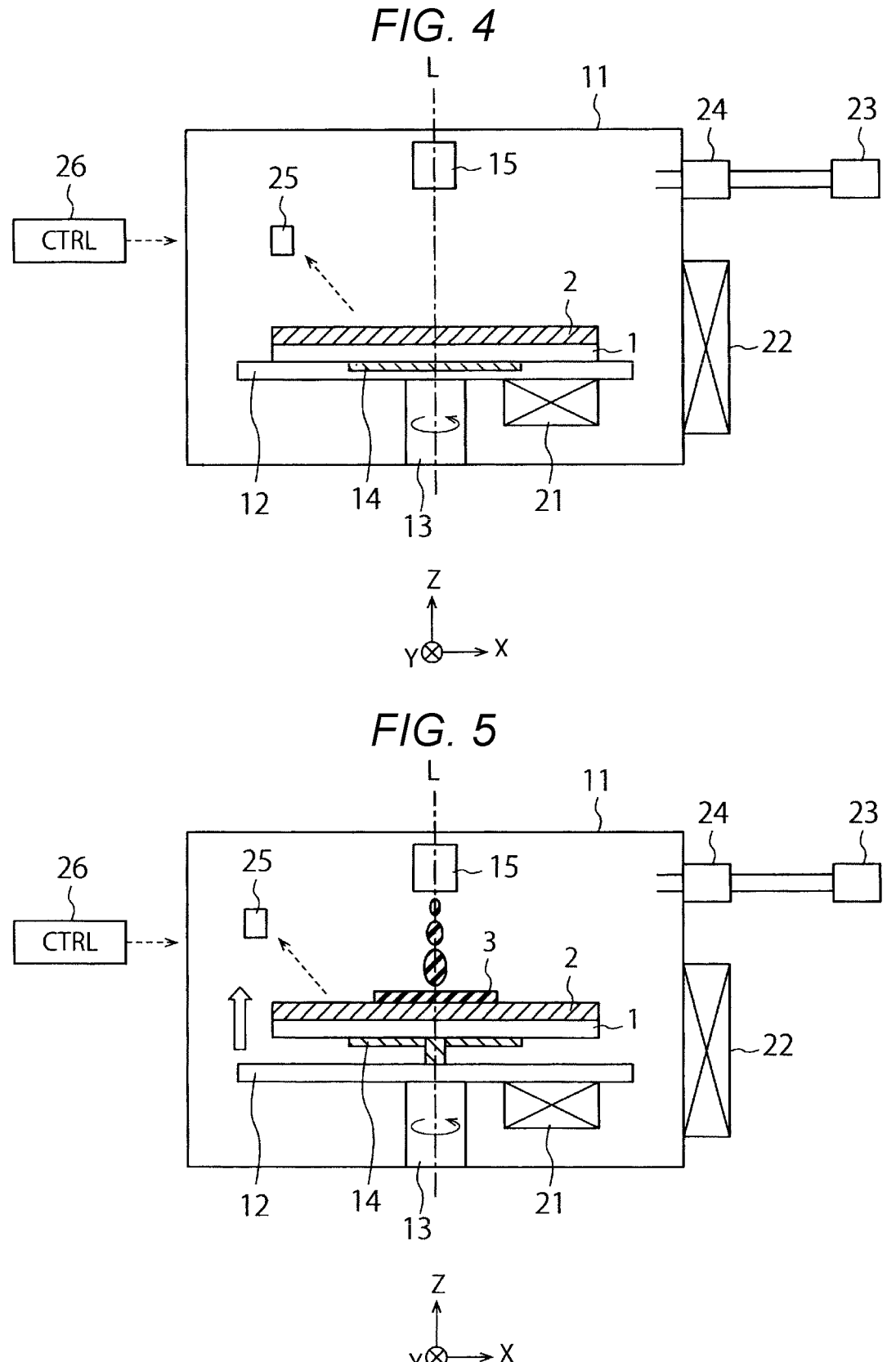
FIG. 4 is a cross-sectional view illustrating a structure of a semiconductor manufacturing device according to a second embodiment.
FIG. 5 is another cross-sectional view illustrating the structure of the semiconductor manufacturing device according to the second embodiment.

FIG. 4 is a cross-sectional view illustrating a structure of a semiconductor manufacturing device according to a second embodiment. FIG. 5 is another cross-sectional view illustrating the structure of the semiconductor manufacturing device according to the second embodiment. FIGS. 4 and 5 illustrate different states of the semiconductor manufacturing device according to the present embodiment. The semiconductor manufacturing device according to the present embodiment is, for example, a coating device for performing processes illustrated in FIGS. 1A to 1C in the method of manufacturing the semiconductor device according to the first embodiment.

The semiconductor manufacturing device according to the present embodiment will be described hereinafter in detail with reference to FIG. 4. In the description, FIG. 5 is also referred to, as appropriate.

The semiconductor manufacturing device according to the present embodiment includes a processing chamber 11, a stage 12, a rotating shaft 13, a rotating chuck 14, a nozzle 15, a temperature regulation section (or temperature regulator) 21, a temperature regulation section (or temperature regulator) 22, a gas supply section 23, a pressure regulation section (or pressure regulator) 24, a sensor 25, and a controller 26. The processing chamber 11 is an example of an accommodation section. The stage 12, the rotating shaft 13, and the rotating chuck 14 are an example of a support section (or a support). The nozzle 15 is an example of a resist material supply section. The temperature regulation section 21, the temperature regulation section 22, the gas supply section 23, the pressure regulation section 24, the sensor 25, and the controller 26 are an example of a resist film forming section.

The processing chamber 11 can accommodate the substrate 1. In the present embodiment, the film 2 is formed on the substrate 1 outside the processing chamber 11 and the substrate 1 is then loaded into the processing chamber 11. FIG. 4 does not illustrate the uneven surface of the film 2.

The stage 12 can support the substrate 1 in the processing chamber 11. In the present embodiment, the substrate 1 loaded into the processing chamber 11 is placed on the stage 12.

The rotating shaft 13 is attached to a lower surface of the stage 12 and supports the stage 12 in the processing chamber 11. The rotating shaft 13 can rotate the substrate 1 placed on the stage 12 about a rotation axis L. The rotating shaft 13 rotates the substrate 1, for example, when the resist material 3 is formed on the film 2 by spin coating in the process illustrated in FIG. 1A, and when the liquid layer 3b is removed by the centrifugal force in the process illustrated in FIG. 1C. FIG. 5 illustrates a state of forming the resist film 3 on the film 2. The rotating shaft 13 is an example of a rotating section.

The rotating chuck 14 is provided on an upper surface of the stage 12 and chucks the substrate 1 placed on the stage 12. It is thereby possible to secure the substrate 1 to the rotating shaft 13 and rotate the substrate 1 by the rotating shaft 13. The rotating chuck 14 can also move up and down the substrate 1 placed on the stage 12. FIG. 4 illustrates the substrate 1 at a height at which the substrate 1 adjoins the stage 12, while FIG. 5 illustrates the substrate 1 at a height at which the substrate 1 does not adjoin the stage 12. According to the present embodiment, the substrate 1 can be rotated not by rotating the substrate 1 together with the heavy stage 12 but by rotating the substrate 1 together with the light rotating chuck 14 (FIG. 5). This can contribute to saving of energy and power for rotating the substrate 1. Further details of the rotating chuck 14 will be described later. The rotating chuck 14 is an example of a lifting section.

The nozzle 15 is provided above the stage 12 and supplies the resist material 3 onto the substrate 1 placed on the stage 12. In FIG. 5, the nozzle 15 delivers the resist material 3 and the resist material 3 is dropped onto the surface of the film 2. In the process illustrated in FIG. 1A, the resist material 3 is supplied from the nozzle 15 to the surface of the film 2 and spread on the surface of the film 2 by rotation of the rotating shaft 13.

The temperature regulation section 21 is attached to the stage 12 and can regulate the temperature of the resist material 3. In the present embodiment, the temperature regulation section 21 is attached to the lower surface of the stage 12. The temperature regulation section 21 includes, for example, a cooling section (or a cooler) that cools the substrate 1 placed on the stage 12 and a heating section that heats the substrate 1 placed on the stage 12. The temperature regulation section 21 can reduce the temperature of the resist material 3 by allowing the cooling section to cool the substrate 1, and increase the temperature of the resist material 3 by allowing the heating section to heat the substrate 1. While the resist material 3 is either cooled or heated via the substrate 1 by the temperature regulation section 21, the resist material 3 may be cooled or heated without via the substrate 1 by the temperature regulation section 21. The temperature regulation section 21 is an example of a first temperature regulation section.

The temperature regulation section 22 is attached to the processing chamber 11 and can regulate the temperature of the resist material 3. In the present embodiment, the temperature regulation section 22 is attached to a side wall of the processing chamber 11 and disposed at a height substantially identical to a height of the stage 12. The temperature regulation section 22 includes, for example, a cooling section that cools the substrate 1 placed on the stage 12 and a heating section that heats the substrate 1 placed on the stage 12. The temperature regulation section 22 can reduce the temperature of the resist material 3 by allowing the cooling section to cool the substrate 1, and increase the temperature of the resist material 3 by allowing the heating section to heat the substrate 1. While the resist material 3 is either cooled or heated via the substrate 1 by the temperature regulation section 22, the resist material 3 may be cooled or heated without via the substrate 1 by the temperature regulation section 22. The temperature regulation section 22 is an example of a second temperature regulation section.

The temperature regulation sections 21 and 22 are used, for example, to cool the resist material 3 in the processes illustrated in FIGS. 1A to 1C. The cooling sections of the temperature regulation sections 21 and 22 can separate the resist material 3 into the gel layer 3a and the liquid layer 3b and form the resist film 3a' from the gel layer 3a by cooling the resist material 3. Meanwhile, the heating sections of the temperature regulation sections 21 and 22 are used, for example, to heat the substrate 1 after forming the resist film 3a' from the gel layer 3a. It is thereby possible to heat the substrate 1 cooled during formation of the resist film 3a' and heat the substrate 1 again. This can reduce dew condensation or the like on the substrate 1.

While the substrate 1 and the resist material 3 in the present embodiment may be either cooled or heated by only one of the temperature regulation sections 21 and 22, the substrate 1 and the resist material 3 are preferably cooled or heated by both of the temperature regulation sections 21 and 22. The reason is as follows. When the substrate 1 and the resist material 3 are cooled or heated by only one of the temperature regulation sections 21 and 22, a temperature gradient tends to occur in the substrate 1 and the resist material 3. According to the present embodiment, both of the temperature regulation sections 21 and 22 cool or heat the substrate 1 and the resist material 3, thereby making it possible to uniformly heat or cool the substrate 1 and the resist material 3. Control to associate an operation of the temperature regulation section 21 with an operation of the temperature regulation section 22 will be described later.

The gas supply section 23 supplies gas into the processing chamber 11. The gas supply section 23 is used, for example, to supply gas for regulating an internal pressure of the processing chamber 11 into the processing chamber 11.

The pressure regulation section 24 can regulate the internal pressure of the processing chamber 11. The pressure regulation section 24 in the present embodiment is disposed on a flow path between the gas supply section 23 and the processing chamber 11. The pressure regulation section 24 regulates supply of the gas from the gas supply section 23 into the processing chamber 11 and discharge of the gas from the processing chamber 11, so that the pressure regulation section 24 can regulate the internal pressure of the processing chamber 11. For example, by opening a valve for supplying the gas from the gas supply section 23 into the processing chamber 11, the internal pressure of the processing chamber 11 can be increased. Furthermore, by opening a valve for discharging the gas from processing chamber 11, the internal pressure of the processing chamber 11 can be reduced.

The pressure regulation section 24 is used, for example, to volatilize the liquid layer 3b (as well as the liquid component in the gel layer 3a) in the process illustrated in FIG. 1C. The pressure regulation section 24 can volatilize the liquid layer 3b by reducing the internal pressure of the processing chamber 11. In the present embodiment, the temperature regulation sections 21 and 22 regulate the temperature of the gel layer 3a to be lower, while the pressure regulation section 24 regulates the internal pressure of the processing chamber 11 to be lower. This can contribute to accelerating the solidification of the gel layer 3a to the resist film 3a'. Control to associate the operations of the temperature regulation sections 21 and 22 with an operation of the pressure regulation section 24 will be described later.

The sensor 25 detects a state of the resist material 3 and outputs a signal indicating a detection result of the state of the resist material 3 to the controller 26. The sensor 25 detects, for example, the state of the resist material 3 that varies depending on the phase separation in the resist material 3. For example, when an optical property of the resist material 3 varies with the phase separation, the sensor 25 irradiates the resist material 3 with light for measuring a physical quantity that indicates this optical property, detects reflected light from the resist material 3, and outputs a signal that indicates a detection result of the reflected light to the controller 26. Thus, by calculating the physical quantity from the detection result of the reflected light, it is possible to identify timing of occurrence of the phase separation from timing of change of the physical quantity. In this case, the sensor 25 is disposed at a position at which the sensor 25 can irradiate the resist material 3 with the light and detect the reflected light from the resist material 3.

The controller 26 controls various operations of the semiconductor manufacturing device according to the present embodiment. The controller 26 controls, for example, the rotation of the rotating shaft 13, the delivery of the resist material 3 by the nozzle 15, the operations of the temperature regulation sections 21 and 22, the supply of the gas by the gas supply section 23, the operation of the pressure regulation section 24, and the operation of the sensor 25.

The controller 26 in the present embodiment receives the signal indicating the detection result of the state of the resist material 3 from the sensor 25. Furthermore, the controller 26 in the present embodiment controls the operations of the temperature regulation sections 21 and 22, the pressure regulation section 24, and the like on the basis of the detection result of the state of the resist material 3 indicated by the signal from the sensor 25. For example, when the signal indicates that the phase separation occurs in the resist material 3, the controller 26 controls the temperature regulation sections 21 and 22 to reduce the temperature of the substrate 1 and controls the pressure regulation section 24 to reduce the internal pressure of the processing chamber 11. It is thereby possible to volatilize the liquid layer 3$b$ separated from the resist material 3 and solidify the gel layer 3$a$ separated from the resist material 3.

Moreover, the controller 26 in the present embodiment controls a relationship between the operation of the temperature regulation section 21 and the operation of the temperature regulation section 22. For example, when determining that the temperature gradient occurs in the substrate 1, the controller 26 may change a ratio of an output from the temperature regulation section 21 to an output from the temperature regulation section 22. This can mitigate the temperature gradient in the substrate 1. In this case, the sensor 25 may detect the temperature of the substrate 1 in a plurality of locations and output a signal indicating a detection result of the temperature of the substrate 1 to the controller 26. The controller 26 can thereby control the operations of the temperature regulation sections 21 and 22 on the basis of this signal. In this case, the sensor 25 may detect the temperature of the resist material 3 as an alternative to the temperature of the substrate 1.

Furthermore, the controller 26 in the present embodiment may control the temperatures of the substrate 1 and the resist material 3 by controlling the operations of the temperature regulation sections 21 and 22 and the operation of the rotating chuck 14. For example, by controlling the rotating chuck 14 to move up the substrate 1, the controller 26 can increase a distance between the temperature regulation section 21 and the substrate 1 and lessen an influence of the cooling section and the heating section in the temperature regulation section 21 on the substrate 1. This can contribute to relaxing the cooling of the substrate 1 and relaxing the heating of the substrate 1.

When the resist material 3 is cooled to cause the phase separation in the resist material 3, the temperature of the resist material 3 is controlled to be preferably equal to or higher than 0° C. and more preferably equal to or higher than 10° C. At this time, the controller 26 preferably controls the operations of the temperature regulation sections 21 and 22 and the rotating chuck 14 so that the temperature of the resist material 3 is equal to or higher than 0° C. (or equal to or higher than 10° C.). For example, the controller 26 may receive a signal indicating a detection result of the temperature of the resist material 3 from the sensor 25, and control the operations of the temperature regulation sections 21 and 22 and the rotating chuck 14 on the basis of this signal.

Figure 6:
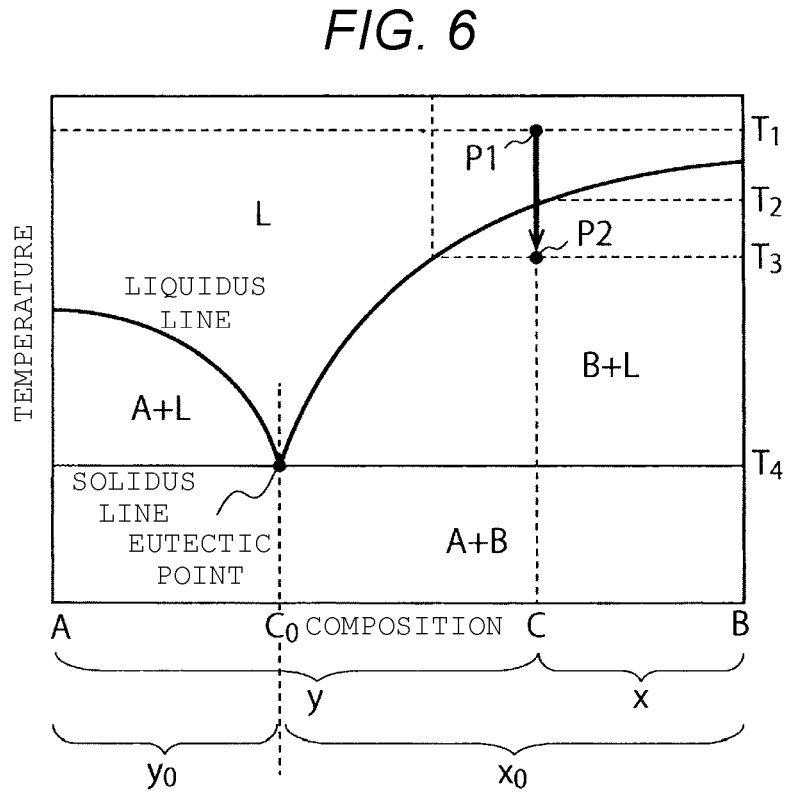
FIG. 6 is a graph illustrating operations of the semiconductor manufacturing device according to the second embodiment.

FIG. 6 is a graph illustrating operations of the semiconductor manufacturing device according to the second embodiment.

FIG. 6 illustrates example of a phase equilibrium diagram of the resist material 3 according to the present embodiment. A vertical axis of FIG. 6 indicates the temperature of the resist material 3. A horizontal axis of FIG. 6 indicates compositions of the resist material 3, specifically, composition ratios of a solvent (A) to a resist polymer (B). A composition ratio "0" represents a case where the resist material 3 contains only the solvent, and a composition ratio "1" represents that the resist material 3 contains only the resist polymer. A point C (x:y) indicates the composition ratio of the resist material 3 according to the present embodiment. A point $C_0$ ($x_0$:$y_0$) indicates a composition ratio of the resist material 3 at an eutectic point at which a solidus line strikes a liquidus line. It is noted that a "solid phase" refers to a layer in which the resist polymer is precipitated, and which is mostly a gel-like layer that is highly viscous but is fluid. This will be referred to as "solid phase," hereinafter.

A point P1 indicates a state when the resist material 3 is formed. The temperature of the resist material 3 at the point P1 is $T_1$, which is, for example, the ordinary temperature or the temperature of the clean room. A point P2 indicates a state when the process (phase separation process) illustrated in FIG. 1B is over. A temperature of the resist material 3 at the point P2 is $T_3$, which is, for example, equal to or higher than 0° C. (or equal to or higher than 10° C.). A temperature $T_2$ between $T_1$ and $T_3$ is a phase separation temperature.

FIGS. 7A to 7D are schematic diagrams illustrating the operations of the semiconductor manufacturing device according to the second embodiment.

Figure 7A:
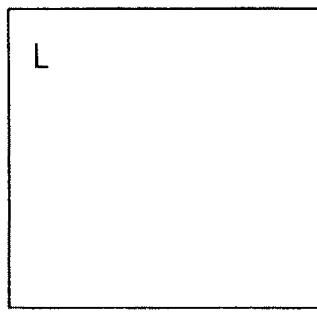
FIGS. 7A to 7D are schematic diagrams illustrating the operations of the semiconductor manufacturing device according to the second embodiment.

FIG. 7A illustrates an internal structure of the resist material 3 when a temperature T of the resist material 3 is higher than $T_1$. In this case, the resist material 3 contains only the liquid phase (L).

Figure 7B:
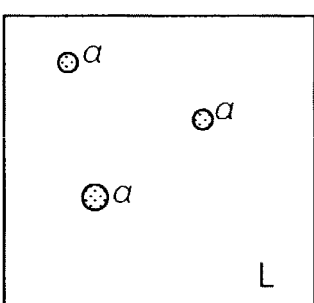

FIG. 7B illustrates an internal structure of the resist material 3 when the temperature T of the resist material 3 falls to be closer to $T_2$. In this case, precipitation of the solid phase (α) starts in the resist material 3.

Figure 7C:
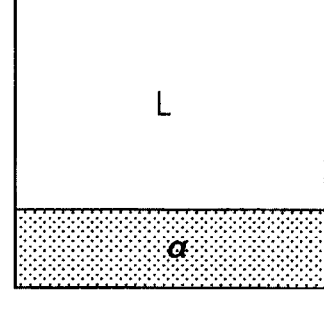

FIG. 7C illustrates an internal structure of the resist material 3 when the temperature T of the resist material 3 falls to $T_3$. In this case, the solid phase and the liquid phase coexist in the resist material 3. In other words, the phase separation occurs in the resist material 3.

Figure 7D:
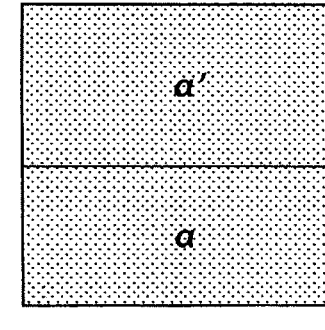

FIG. 7D illustrates an internal structure of the resist material 3 when the temperature T of the resist material 3 is lower than $T_4$. In this case, two layers (α, α') of the solid phases are separately formed in the resist material 3. α' herein corresponds to the solid phase into which the solvent is transformed in the resist material 3. In the present embodiment, in FIG. 7C, the solid phase (α) is deposited on the substrate 1 and an interface between the solid phase (α) and the liquid phase (L) is flat under control of either the temperature or the pressure.

As described so far, the semiconductor manufacturing device according to the present embodiment includes the temperature regulation sections 21 and 22 that regulate the temperature of the resist material 3, the pressure regulation section 24 that regulates the internal pressure of the processing chamber 11, and the like. According to the present embodiment, therefore, the planarity of the surface of the resist film 3$a$' formed from the resist material 3 can be improved. For example, according to the present embodiment, by separating the resist material 3 into the gel layer 3$a$ and the liquid layer 3$b$ and forming the resist film 3$a$' from the gel layer 3$a$, it is possible to improve the planarity of the surface of the resist film 3$a$'.

It is noted that the embodiments of the disclosure may be implemented in the following modes.

(Appendix 1)

A semiconductor manufacturing device including:

an accommodation section that accommodates a substrate;

a support section that supports the substrate;

a resist material supply section that supplies a resist material onto the substrate; and a resist film forming section that includes a first temperature regulation section attached to the support section and a second temperature regulation section attached to the accommodation section, and that forms a resist film from the resist material by allowing the first temperature regulation section and the second temperature regulation section to regulate a temperature of the resist material.

(Appendix 2)

The semiconductor manufacturing device according to Appendix 1, wherein the first temperature regulation section and the second temperature regulation section include a first cooling section (or a first cooler) and a second cooling section (or a second cooler) that cool the substrate, respectively.

(Appendix 3)

The semiconductor manufacturing device according to Appendix 2, wherein the first temperature regulation section and the second temperature regulation section further include a first heating section and a second heating section that heat the substrate, respectively.

(Appendix 4)

The semiconductor manufacturing device according to Appendix 1, wherein the resist film forming section includes a controller that controls a relationship between an operation of the first temperature regulation section and an operation of the second temperature regulation section.

(Appendix 5)

The semiconductor manufacturing device according to Appendix 1, wherein the resist film forming section includes a pressure regulation section that regulates an internal pressure of the accommodation section, and forms the resist film from the resist material by allowing the first temperature regulation section and the second temperature regulation section to regulate the temperature of the resist material and allowing the pressure regulation section to regulate the internal pressure of the accommodation section.

(Appendix 6)

The semiconductor manufacturing device according to Appendix 5, wherein the resist film forming section includes a gas supply section that supplies gas into the accommodation section, and the pressure regulation section regulates the internal pressure of the accommodation section by regulating at least one of supply of the gas from the gas supply section into the accommodation section and discharge of the gas from the accommodation section.

(Appendix 7)

The semiconductor manufacturing device according to Appendix 1, wherein the resist film forming section includes:

a sensor that detects a state of the resist material; and a controller that controls operations of the first temperature regulation section and the second temperature regulation section on the basis of a detection result of the state of the resist material by the sensor.

(Appendix 8)

The semiconductor manufacturing device according to Appendix 7, wherein the sensor detects the state of the resist material that varies depending on phase separation in the resist material.

(Appendix 9)

The semiconductor manufacturing device according to Appendix 1, wherein the support section includes a lifting section that moves up and down the substrate supported by the support section, and the resist film forming section includes a controller that controls the temperature of the resist material by controlling an operation of the lifting section.

(Appendix 10)

The semiconductor manufacturing device according to Appendix 1, wherein the resist film forming section separates the resist material into a gel layer and a liquid layer on the substrate, and forms the resist film from the gel layer.

(Appendix 11)

The semiconductor manufacturing device according to Appendix 10, wherein the resist film forming section separates the resist material into the gel layer and the liquid layer by allowing the first temperature regulation section and the second temperature regulation section to regulate the temperature of the resist material.

(Appendix 12)

The semiconductor manufacturing device according to Appendix 10, wherein the resist film is formed from the gel layer by removing the liquid layer that is separated from the gel layer from the substrate.

(Appendix 13)

The semiconductor manufacturing device according to Appendix 12, wherein the resist film forming section includes a pressure regulation section that regulates an internal pressure of the accommodation section, and the liquid layer is volatilized and removed from the substrate by allowing the pressure regulation section to regulate the internal pressure of the accommodation section.

(Appendix 14)

The semiconductor manufacturing device according to Appendix 12, wherein the support section includes a rotating section that rotates the substrate supported by the support section, and the liquid layer is removed from the substrate by a centrifugal force by allowing the rotating section to rotate the substrate.

(Appendix 15)

A method of manufacturing a semiconductor device including:

forming a resist material on a substrate;

separating the resist material into a gel layer and a liquid layer on the substrate; and removing the liquid layer on the substrate, and forming a resist film from the gel layer.

(Appendix 16)

The method of manufacturing a semiconductor device according to Appendix 15, further including forming a first film having an uneven surface on the substrate, wherein the resist material is formed on the first film, and the resist film is used as a mask for processing the first film.

(Appendix 17)

The method of manufacturing a semiconductor device according to Appendix 15, wherein the resist material is a material that goes through phase separation in response to a temperature change.

(Appendix 18)

The method of manufacturing a semiconductor device according to Appendix 15, wherein the resist material is separated into the gel layer and the liquid layer by being formed on the first film at a first temperature and being cooled down to a second temperature lower than the first temperature.

(Appendix 19)

The method of manufacturing a semiconductor device according to Appendix 18, wherein the second temperature is equal to or higher than 0° C.

(Appendix 20)

The method of manufacturing a semiconductor device according to Appendix 15, wherein the resist film is formed from the gel layer by removing the liquid layer on the substrate and removing at least part of a liquid component in the gel layer from the gel layer.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor manufacturing device comprising:

a processing chamber that accommodates a substrate;

a support that supports the substrate;

a nozzle that supplies a resist material onto the substrate; and a first temperature regulator attached to the support and a second temperature regulator attached to the processing chamber, wherein at least one of the first temperature regulator or the second temperature regulator forms a resist film from the resist material by reducing a temperature of the resist material on the substrate to a temperature lower than a phase separation temperature of the resist material at which phase separation occurs in the resist material.

2. The semiconductor manufacturing device according to claim 1, wherein the first temperature regulator and the second temperature regulator include a first cooler and a second cooler that cool the substrate, respectively.

3. The semiconductor manufacturing device according to claim 1, further comprising:

a pressure regulator that regulates an internal pressure of the processing chamber, wherein the resist film is formed from the resist material by allowing the first temperature regulator and the second temperature regulator to regulate the temperature of the resist material and allowing the pressure regulator to regulate the internal pressure of the processing chamber.

4. The semiconductor manufacturing device according to claim 1, further comprising:

a controller that controls a relationship between an operation of the first temperature regulator and an operation of the second temperature regulator.

5. The semiconductor manufacturing device according to claim 4, wherein the controller is configured to:

determine that a temperature gradient occurs in the substrate; and change a ratio of an output from the first temperature regulator to an output from the second temperature regulator.

6. The semiconductor manufacturing device according to claim 4, further comprising:

a sensor that detect a temperature of the substrate and outputs a signal indicating the detected temperature to the controller, wherein the controller is configured to control the operation of the first temperature regulator and the operation of the second temperature regulator on the basis of the signal.

7. The semiconductor manufacturing device according to claim 6, the sensor detects the temperature of the resist material.

8. The semiconductor manufacturing device according to claim 4, wherein the controller is configured to control temperatures of the substrate and the resist material by controlling the operations of the first temperature regulator and the second temperature regulator and an operation of the support.

9. The semiconductor manufacturing device according to claim 8, wherein the support is a rotating chuck.

10. The semiconductor manufacturing device according to claim 9, wherein the controller is configured to control the rotating chuck to move up the substrate to increase a distance between the first temperature regulator and the substrate and lessen an influence of the first temperature regulator and the second temperature regulator.

* * * * *